(12) United States Patent
Singh et al.

(10) Patent No.: US 7,075,380 B2
(45) Date of Patent: Jul. 11, 2006

(54) WIDELY TUNEABLE AND FULLY DIFFERENTIAL LC OSCILLATOR UTILIZING AN ACTIVE INDUCTOR

(75) Inventors: Prashant Singh, Eden Praire, MN (US); Donald Grillo, Lakeville, MN (US); Brett Hardy, Chaska, MN (US)

(73) Assignee: LSI Logic Corporation, Milpitas, CA (US)

( * ) Notice: Subject to any disclaimer, the term of this patent is extended or adjusted under 35 U.S.C. 154(b) by 325 days.

(21) Appl. No.: 10/653,588

(22) Filed: Sep. 2, 2003

(65) Prior Publication Data

US 2005/0046502 A1 Mar. 3, 2005

(51) Int. Cl.
*H03B 5/00* (2006.01)

(52) U.S. Cl. .............................. 331/117 R; 331/117 FE
(58) Field of Classification Search ............ 331/117 R, 331/167, 117 FE, 181, 132, 115
See application file for complete search history.

(56) References Cited

U.S. PATENT DOCUMENTS

| | | | | |
|---|---|---|---|---|
| 5,198,783 A | * | 3/1993 | Jemison et al. | 331/66 |
| 5,347,238 A | * | 9/1994 | Kobayashi | 331/117 R |
| 5,821,825 A | * | 10/1998 | Kobayashi | 331/66 |
| 5,850,163 A | * | 12/1998 | Drost et al. | 331/115 |
| 6,107,893 A | * | 8/2000 | Forbes | 331/132 |

OTHER PUBLICATIONS

VHF CMOS integrated active inductor; A. Thanachayanont and A. Payne; Electronics Letters, May 23, 1996, vol. 32, No. 11.
2.5 GHZ Second– and Fourth–Order Inductorless RF Bandpass Filters; Apinunt Thanachayanont; King Mongkut's Institute of Technology.
A Sixth–Order UHF Bandpass Filter Using Silicon Bipolar Active Inductors; Choon Haw Leong and Gordon W. Roberts; Microelectronics and Computer Systems Laboratory; McGill University Jun. 1998.
Study and Simulation of CMOS LC Oscillator Phase Noise and Jitter; Michael S. McCorquodale, Mei Kim Ding and Richard B. Brown; Department of Electrical Engineering and Computer Science; Solid State Electronics Laboratory; University of Michigan.

* cited by examiner

*Primary Examiner*—Joseph Chang
(74) *Attorney, Agent, or Firm*—Suiter-West-Swantz PC LLP

(57) ABSTRACT

An inductor-capacitor voltage controlled oscillator is implemented using an active inductor. The active inductor may use bipolar technology or CMOS technology. The VCO with an active inductor offers a more compact design and is useable with flip chip technology. The active inductor may be implemented in bipolar junction or complementary metal oxide semiconductor technology. The configuration of the voltage controlled oscillator with an active inductor of the present invention is fully differential and fully symmetric.

10 Claims, 6 Drawing Sheets

WIDELY TUNEABLE AND FULLY DIFFERENTIAL LC OSCILLATOR UTILIZING AN ACTIVE INDUCTOR

FIELD OF THE INVENTION

The present invention generally relates to the field of voltage controlled oscillators, and particularly to inductor-capacitor (LC) voltage controlled oscillators.

BACKGROUND OF THE INVENTION

Voltage controlled oscillators (VCOs) are very useful components for a wide variety of integrated circuit applications. Voltage controlled oscillators (VCO) may be implemented using a parallel combination of a passive inductance (L) and a passive capacitance (C). The voltage and current for an inductor are related as V=L di/dt. For a capacitor, the relationship of current and voltage is i=C dV/dt or V=1/C∫i dt. Applying Kirchoff's voltage law for the parallel combination of an inductor and capacitor, L di/dt=1/C∫i dt. The relationship of voltage and current between the parallel inductor and capacitor may be rearranged and differentiated such that L $d^2i/d^2t$–1/C i. A solution to this equation is i=$i_0$ sin ωt, where ω=1/√LC. Thus, a sinusoidal timing signal may be generated by the VCO at an operating frequency of f=½π1/√LC.

Thus far, LC VCOs have been limited to wirebond designs. Flip chip designs, which use conductive bumps to make electrical connections, offer smaller sizes, improved performance, and lower cost, as well as flexibility and reliability, when compared to wirebond. The use of an LC VCO in a silicon flip chip design is hampered by the need to synthesize the L with a spiral inductor and the lack of tunability. VCO configurations with spiral inductors consume a large amount of silicon area, can have poor performance when used in flip chip applications, have a low quality factor, and may interact with adjacent metal layers and flip chip underfill material. Wirebond is not suitable for high speed, high density IO that are commonly found on Application Specific Integrated Circuits (ASICs).

Therefore, it would be desirable to reduce the size of a voltage controlled oscillator by replacing the passive inductor with an active inductor.

SUMMARY OF THE INVENTION

Accordingly, the present invention is directed to a voltage controlled oscillator that uses an active inductor. By using an inductor synthesized through the use of an active circuit and placing the circuit in the VCO, the advantages of an LC VCO are maintained while the disadvantages associated with a spiral inductor are eliminated.

In a first aspect of the present invention, a voltage controlled oscillator includes an active inductor and a capacitance. The active inductor and capacitance establish a frequency of a timing signal output by the voltage controlled oscillator.

In a second aspect of the present invention, a method is provided for generating a timing signal using an active inductor in an inductor-capacitor voltage controller oscillator. In the method, the ends of a capacitor electrically connected in parallel with the active inductor are alternately charged and discharged. A differential voltage is generated across the active inductor in response to the charging and discharging of the capacitor, thus simulating inductor behavior.

The active inductor of the present invention offers several advantages. It is more compact since no spiral inductor is used. The VCO with the active inductor easily achieves the metallization design rules and so reduces or eliminates cross contamination and does not rely on the quality of passive components. The voltage controlled oscillator may be tuned by adjusting either the capacitor or the inductor. The phase noise is superior to that of ring oscillator implementations. The present invention may be implemented in flip chip or wirebond applications and may use a bipolar or CMOS active inductor.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present invention relates to a voltage controlled oscillator that generates a timing signal from the parallel combination of a capacitor and an active inductor. The active inductor may be implemented in bipolar junction or metal oxide semiconductor technology. The configuration of the voltage controlled oscillator with an active inductor of the present invention is fully differential and fully symmetric. The voltage controlled oscillator may be used in flip chip or wirebond applications.

Figure 1:
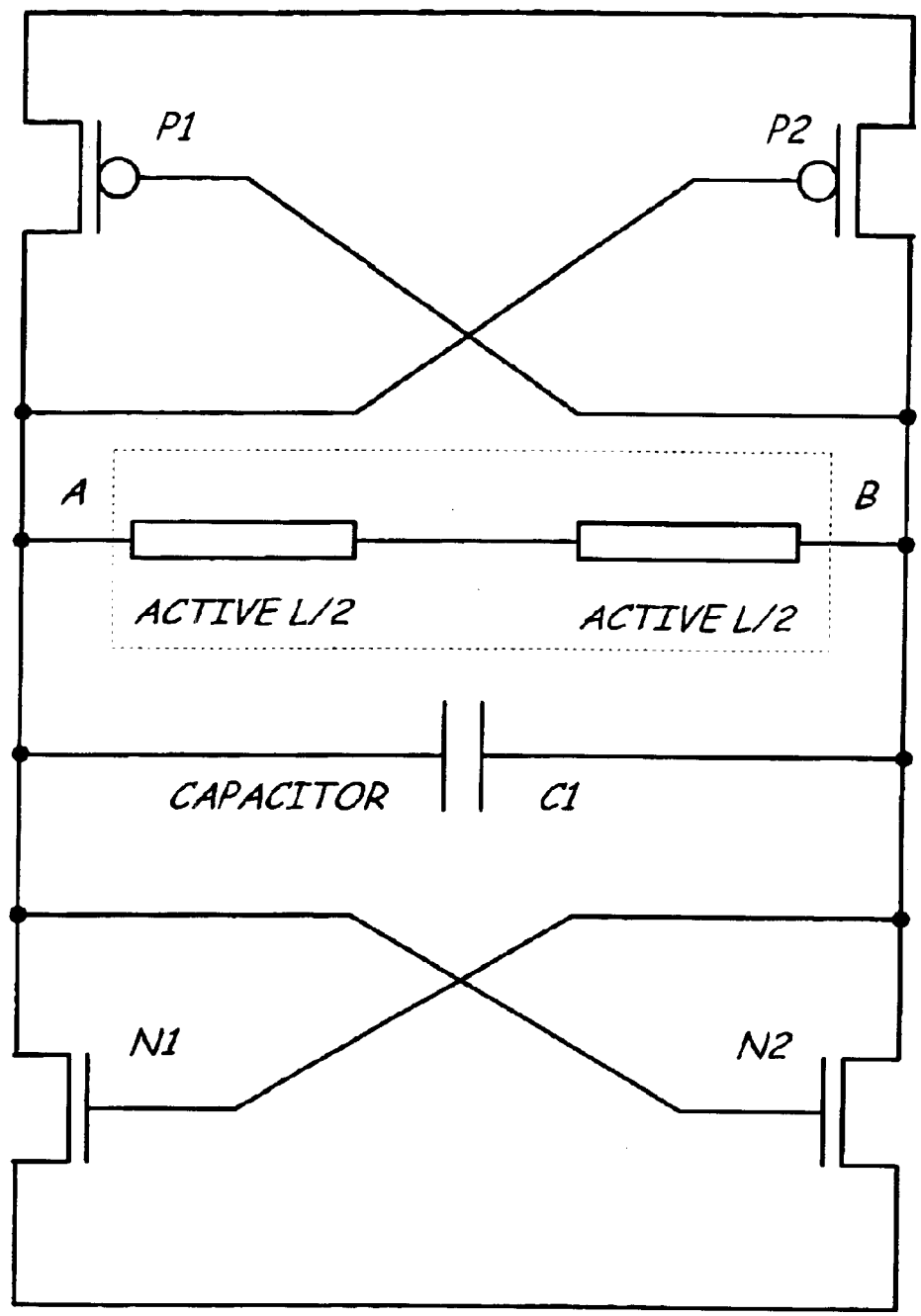
FIG. 1 shows an LC voltage controlled oscillator of the present invention.

FIG. 1 shows an embodiment of a circuit of the present invention. The active inductor and the capacitor C1 are electrically connected in parallel such that the voltage across the capacitor is the same as the voltage across the inductor. The parallel combination of the inductance and capacitance C1 from a parallel resonant circuit. In a parallel resonant circuit, the voltage across the capacitor and inductor are the same; however, a time varying current alternately flows from the inductor to the capacitor. The frequency of the oscillation of the current is set by the values of L and C. The devices P1, P2, N1, and N2 provide current into the parallel resonant circuit to start and sustain the oscillation. Because voltage across the inductor is directly proportional to the change in current over time through the inductor, the inductor current is constantly changing in a manner consistent with the voltage present across the capacitor C1, resulting in a time varying, sinusoidal waveform. Negative charge is supplied to the capacitor C1 alternately through PMOS transistors P1 and P2. When the voltage at node B is sufficiently low, transistor P1 is turned ON and NMOS transistor N1 is turned OFF such that charge flows to node A of the capacitor C1. During this time, transistor P2 is turned OFF and transistor N2 is turned ON to discharge the node B end of capacitor C1. Node A, initially positive, becomes increasing negative because of the time varying current flow through the impedance of the parallel resonant circuit. During the other half of the cycle, node B becomes sufficiently positive to turn OFF transistor P1 and turn ON transistor N1. A sinusoidal waveform results at nodes A and B.

Figure 2:
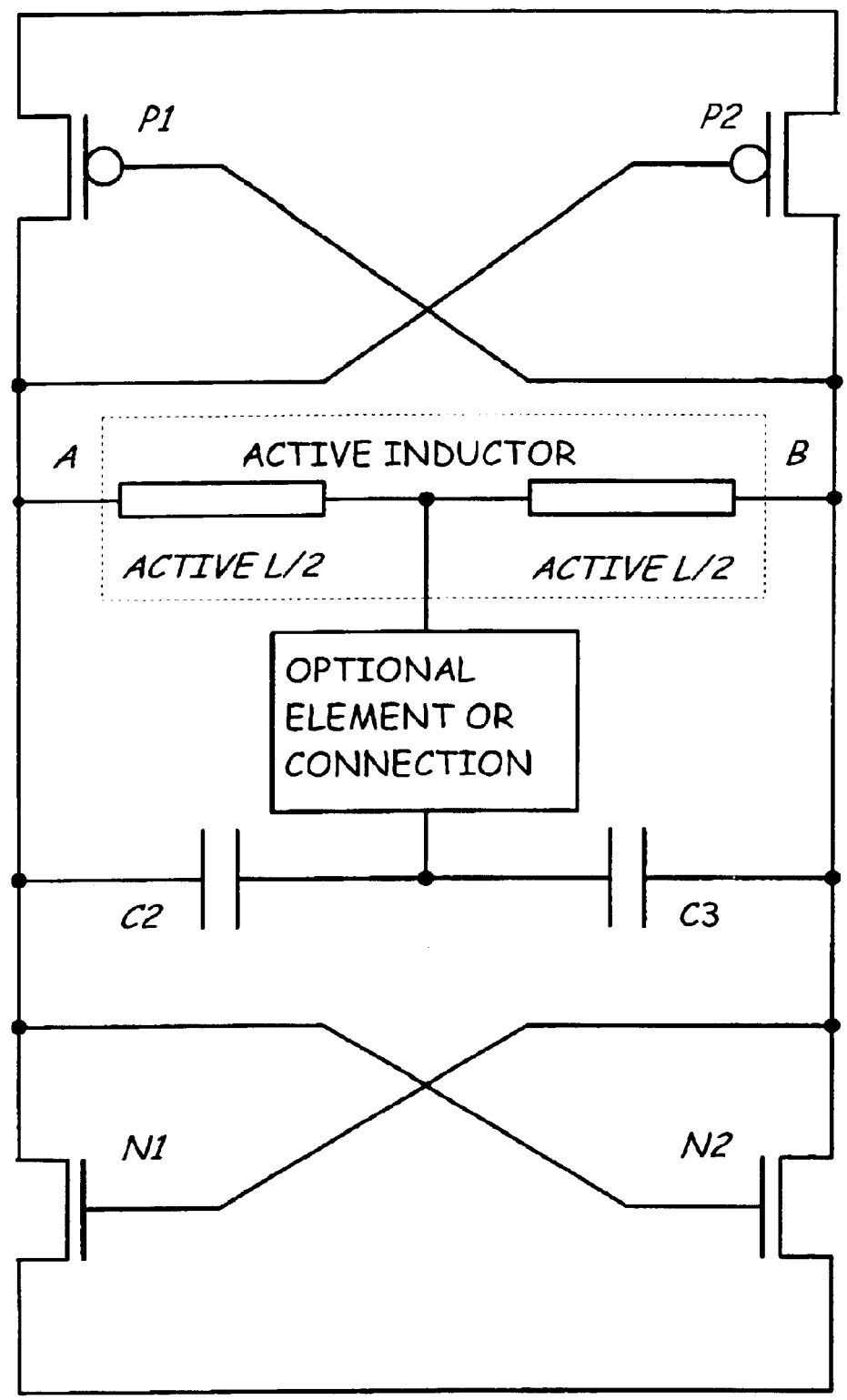
FIG. 2 shows an alternate embodiment of the general circuit of the present invention.

FIG. 2 shows an alternate embodiment of a circuit of the present invention. Two active inductors are formed. The capacitance is represented by capacitances C2 and C3. An optional element or connection may be electrically connected to the nodes of the inductors and the capacitors. The optional element or connection may be a circuit ground or a simple connection to the two nodes to form one node. In the case where the simple connection forms a single node, the single node may be tied to circuit ground or a power supply through a passive or active component. For instance, a passive element may be a resistor or capacitor. Other arrangements are possible. For example, the active inductor may be effectively undivided whereas the capacitance may be formed of two capacitors. The two capacitors may be tied to circuit ground directly or through a passive component or may be tied to a power supply through a passive component. Additionally or alternatively, a resistor may be electrically connected in parallel with each capacitor. As another example, the active inductor may be divided, whereas the capacitor is undivided. Because the voltage controlled oscillator is supplied power by a power supply, any resistive losses do not dampen the oscillation.

Figure 3:
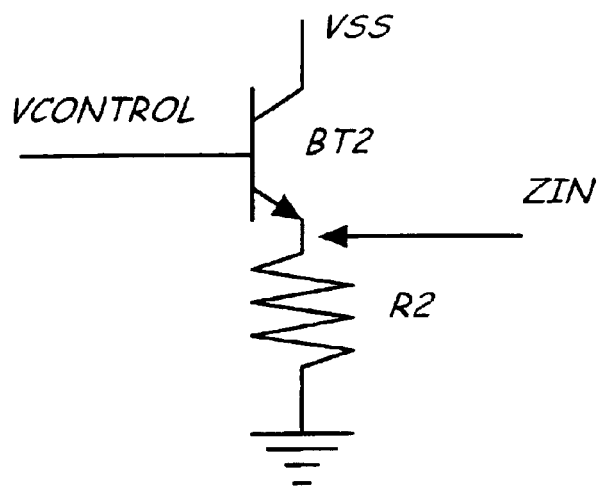
FIG. 3 shows an active inductor formed using bipolar technology.

FIG. 3 shows an active inductor formed by a bipolar transistor BT2 and an emitter resistor. Node Zin is formed at the electrical junction of the emitter of transistor BT2 and resistor R2. A control voltage at the base of transistor BT2 synthesizes the inductance at node Zin. The inductance is directly proportional the transistors internal capacitance and is inversely proportional to the transistor beta. Two of the bipolar inductors are electrically connected through their base electrodes to form a bipolar active inductor.

Figure 4:
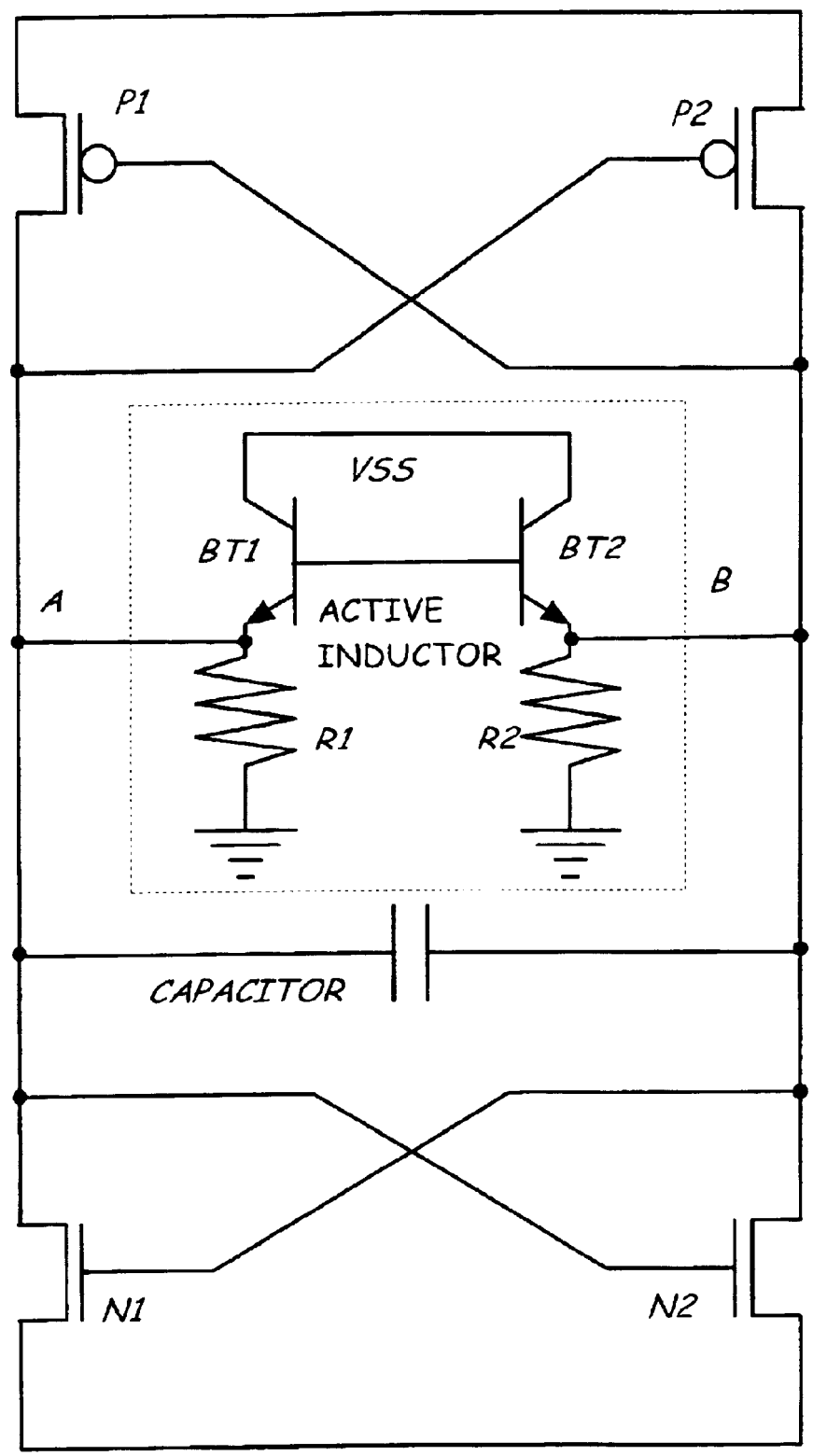
FIG. 4 shows the incorporation of a bipolar active inductor into a complementary metal oxide semiconductor (CMOS) voltage controlled oscillator.

FIG. 4 shows an embodiment of the VCO in which a bipolar active inductor used in a fully differential widely tunable CMOS voltage controlled oscillator. Bipolar transistors BT1 and BT2 form a differential pair and should be identical or as closely matched as possible. For a constant current condition at nodes A and B, the voltage across the two nodal points is approximately zero volts. A change in current at either node A or B is transferred to the other node after a time delay. During the time delay, a potential difference exists across nodes A and B, simulating inductor behavior.

Figure 5:
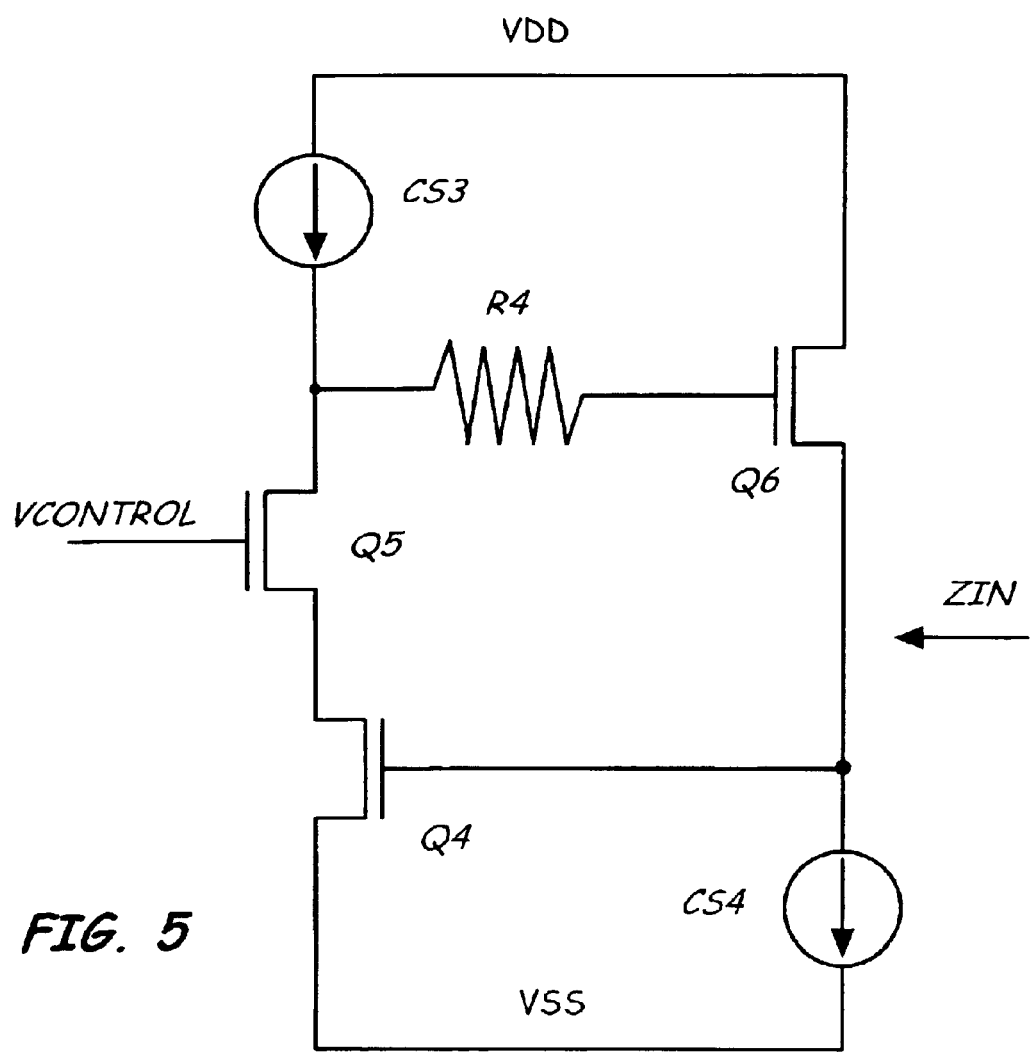
FIG. 5 shows an active inductor formed using CMOS technology.

FIG. 5 shows an embodiment of an active inductor using CMOS technology. Although transistors Q4, Q5, and Q6 are shown as NMOS transistors, PMOS transistors may be used instead. Current sources CS3 and CS4 are used to illustrate the current flow paths in the active inductor. The resistor R4 limits the flow of charge to and from the gate electrode of transistor Q6. Because the gate voltage of transistor Q6 is always higher than the source voltage, transistor Q6 is always turned on to permit current flow from the drain to the source. The combination of Q6 and R4 will result in an inductance provided that R4 is greater than the transconductance of Q6. If R4 is less than the transconductance of Q6, then the circuit appears capacitive. The presence of transistors Q4 and Q5 act to reduce the effective transconductance of Q6, and the control voltage VCONTROL affects the change in transconductance that Q4 and Q5 apply to Q6. This increases the range of operating conditions over which the circuit will appear inductive. The inductance is approximated as being proportional to the gate-source capacitance of transistor Q5 multiplied by R4 and the effective transconductance of Q4.

Figure 6:
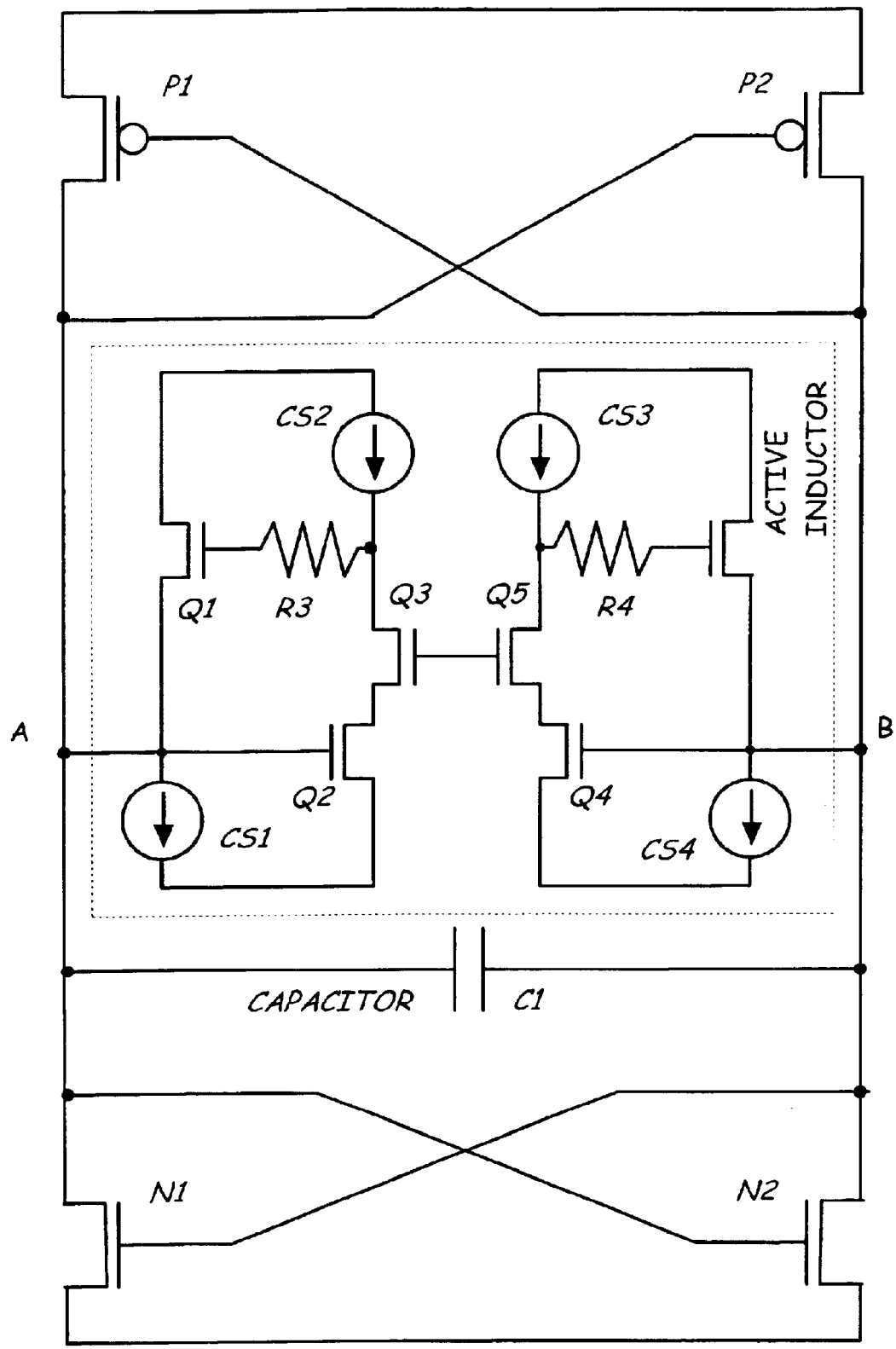
FIG. 6 shows a CMOS active inductor incorporated into a CMOS VCO.

FIG. 6 shows an embodiment of a voltage controlled oscillator in which two of the inductors of FIG. 5 are joined together in a differential arrangement through the electrical connection of the gate electrodes of transistors Q3 and Q5. When there is no change in either nodal voltage, there is no voltage differential across the active inductor.

Figure 7:
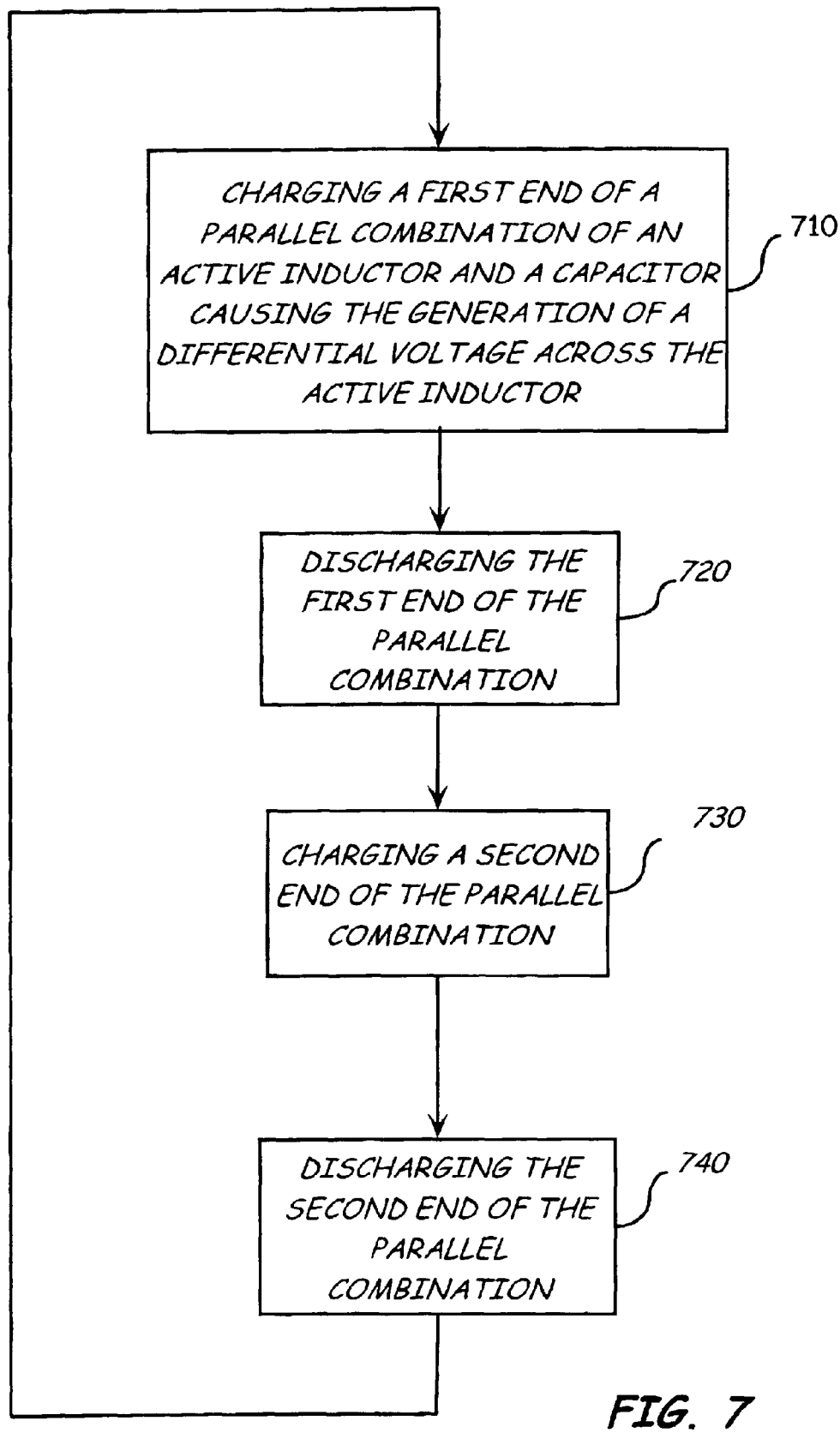
FIG. 7 shows a flow chart of an embodiment of a method of the present invention.

FIG. 7 shows a flow chart for an embodiment of the method of the present invention. One end of the active inductor—capacitor parallel combination is charged 710. The charging causes a difference in potential across the inductor, approximating the behavior of an inductor or coil. That same end is then discharged 720 which cases a potential of the opposite polarity to form across the active inductor. The opposite end is charged 730 and discharged 740, causing the development of potentials across the active inductor. In the preferred embodiment, steps 710 and 740 occur simultaneously or nearly so and steps 720 and 730 are essentially synchronized such that steps 710 and 740 are alternately performed with steps 720 and 730.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages, the form hereinbefore described being merely an explanatory embodiment thereof. It is the intention of the following claims to encompass and include such changes.

What is claimed is:

1. A voltage controlled oscillator, comprising:
   an active inductor; and
   a capacitance electrically connected in parallel with the active inductor, the active inductor and capacitance establishing a frequency of a timing signal output by the voltage controlled oscillator, wherein the active inductor includes two bipolar transistors, the two bipolar transistors being electrically connected to each other through their base electrodes, each of the bipolar transistors being electrically connected to a circuit ground through a resistor, inductive ends of the active inductor being located between an emitter of each of the bipolar transistors and the resistor corresponding to that bipolar transistor.

2. The voltage controlled oscillator of claim 1, further comprising first and second PMOS transistors and first and second NMOS transistors, gates of the first PMOS and NMOS transistors being controlled by voltage at an opposing second end of the active inductor and gates of the second PMOS and NMOS transistors being controlled by a voltage at a first end of the active inductor.

3. The voltage controlled oscillator of claim 2, wherein the bases of the two bipolar transistors are electrically connected to one another only.

4. The voltage controlled oscillator of claim 2, wherein the bases of the two bipolar transistors are electrically connected to a power supply through a resistor.

5. The voltage controlled oscillator of claim 2, wherein the bases of the two bipolar transistors are electrically connected to circuit ground through a resistor.

6. A method for generating a timing signal using an active inductor in an inductor-capacitor voltage controller oscillator, comprising:
   charging and discharging first and second ends of a capacitor electrically connected in parallel with the active inductor;
   generating a differential voltage across the active inductor in response to the charging and discharging of the capacitor; and
   supplying charge to the capacitor and active inductor through one of two switches that are alternately turned on and off.

7. The method of claim 6, further comprising alternately discharging the first end of the capacitor while the second end of the capacitor is being charged and charging the first end of the capacitor while the second end of the capacitor is being discharged.

8. The method of claim 6, wherein the active inductor includes bipolar transistors.

9. A widely tunable and fully differential inductor capacitor voltage controlled oscillator comprising:
   means for synthesizing an active inductor using active circuitry; and
   means for generating a timing signal based on an electrical parallel relationship between the active inductor and a capacitor, wherein the means for generating a timing signal include means for charging the active inductor and capacitor and means for discharging the active inductor and capacitor, wherein means for synthesizing an active inductor is differentially connected to the means for generating a timing signal.

10. The widely tunable and fully differential inductor capacitor voltage controlled oscillator of claim 9, wherein the means for synthesizing an active inductor includes bipolar switches.

* * * * *